United States Patent [19]

Parr et al.

[11] 4,198,232

[45] Apr. 15, 1980

[54] PREPARATION OF MONOTECTIC ALLOYS HAVING A CONTROLLED MICROSTRUCTURE BY DIRECTIONAL SOLIDIFICATION UNDER DOPANT-INDUCED INTERFACE BREAKDOWN

[75] Inventors: Richard A. Parr, Hollywood; Mary H. Johnston; John C. McClure, both of Huntsville, all of Ala.

[73] Assignee: The United States of America as represented by the Administrator of the National Aeronautics and Space Administration, Washington, D.C.

[21] Appl. No.: 974,292

[22] Filed: Dec. 29, 1978

[51] Int. Cl.² .............................................. C22C 1/02
[52] U.S. Cl. ...................................... 75/135; 75/138; 75/178 R; 148/32
[58] Field of Search .................... 75/135, 134 H, 138, 75/178 R; 148/32

[56] References Cited

U.S. PATENT DOCUMENTS 3,434,827  3/1969  Lemkey .............................. 75/134 H Primary Examiner—R. Dean
Attorney, Agent, or Firm—J. H. Beumer; J. R. Manning; L. D. Wofford, Jr.

[57] ABSTRACT

Monotectic alloys having aligned spherical particles or rods of the minor component dispersed in a matrix of the major component are prepared by forming a melt containing predetermined amounts of the major and minor components of a chosen monotectic system, providing in the melt a dopant capable of breaking down the liquid-solid interface for the chosen alloy, and directionally solidifying the melt at a selected temperature gradient and a selected rate of movement of the liquid-solid interface (growth rate). Shaping of the minor component into spheres or rods and the spacing therebetween are controlled by the amount of dopant and the temperature gradient and growth rate values. Specific alloy systems include Al-Bi, Al-Pb and Zn-Bi, using a transition element such as iron.

11 Claims, 11 Drawing Figures

4,198,232

PREPARATION OF MONOTECTIC ALLOYS HAVING A CONTROLLED MICROSTRUCTURE BY DIRECTIONAL SOLIDIFICATION UNDER DOPANT-INDUCED INTERFACE BREAKDOWN

ORIGIN OF THE INVENTION

This invention was made by employees of the United States Government and may be manufactured and used by or for the Government of the United States for governmental purposes without the payment of any royalties thereon or therefor.

BACKGROUND OF THE INVENTION

This invention relates to metallic composite materials and more particularly to monotectic alloys having a dispersed phase of solidification products distributed within a matrix, and to methods of producing such materials.

Numerous applications exist for composite materials having particles, rods or filaments of one metal or compound dispersed uniformly within a matrix of another. The dispersed component can be selected to provide characteristics such as superconductivity, lubricity, catalytic activity or capability for undergoing nuclear or electronic reactions, while the matrix provides required bulk properties, including structural integrity and resistance to wear and corrosion. Although the utility and advantages of such materials are readily apparent, much difficulty has been encountered in preparing them, particularly in the case of monotectic alloy systems that show a liquid miscibity gap. Methods useful for other types of alloy systems are generally ineffective for monotectic systems because of gravity-induced segregation, which results in non-uniform distribution of the dispersed component.

Various prior workers have reported preparation of monotectic alloys having an aligned microstructure by means of directional solidification, with the dispersed phase taking the form of filaments or rods, or in some cases irregular drops. Rod-like structures have been obtained by solidification of monotectics of the Bi-Se system, Knight et al, Transactions of the Metallurgical Society—AIME, Vol. 245 (1969) at 351; the Cu-Cu$_2$S system, Marich et al, Metallurgical Transactions, Vol. 2 (1971) at 2681; and the Sb-Se system (Lemkey, U.S. Pat. No. 3,434,827), but the structures obtained are of irregular spacing or sizing. Prior techniques for controlling the distribution of rods or spheres of a minor constituent of an alloy which separates in the liquid phase owing to liquid phase immiscibility and density differences were thought to be limited to the relatively few systems in which a second liquid phase ($L_{II}$) is trapped by an advancing planar interface during directional solidification. Provision of a method of controlling distribution which does not require an inherent capability for entrapment of the second liquid phase would make available many monotectic alloy systems that have not been amenable to fabrication into useful articles.

It is therefore an object of this invention to provide monotectic alloys having the minor component thereof uniformly dispersed in the form of particles or rods in a matrix of the major component.

Another object is to provide a process for preparing monotectic alloys wherein the distribution, shape and size of the dispersed component are controlled.

Still another object is to provide a directional solidification process for preparation of monotectic alloys in which control of distribution of particles of the dispersed component is not dependent upon inherent entrapment of the second liquid phase at an advancing planar interface.

SUMMARY OF THE INVENTION

In the present invention monotectic alloys having aligned spherical particles or rods dispersed in a matrix are prepared by forming a melt containing a major component and a minor component of a chosen alloy, providing in the melt a dopant capable of breaking down the liquid-solid interface for the chosen alloy, and directionally solidifying the melt at a predetermined temperature gradient and growth rate. We have found that control of shape and distribution of the dispersed component in directional solidification of monotectic alloys can be realized by dopant induced breakdown of the advancing interface, independent of any entrapment which might otherwise occur. Monotectic alloy systems previously considered useless because of their lack of amenability to preparation in a form having a controlled microstructure can now be fabricated into composite articles with properties suitable for a variety of applications.

BRIEF DESCRIPTION OF THE DRAWINGS

The construction designed to carry out the invention will be hereinafter described, together with other features thereof.

The invention will be more readily understood from a reading of the following specification and by reference to the accompanying drawing forming a part thereof, wherein an example of the invention is shown and wherein.

DETAILED DESCRIPTION

The invention is broadly applicable to monotectic alloy systems that show a miscibility gap in the liquid state. Hundreds of systems of this type have been reported in the literature. Lemke in U.S. Pat. No. 3,434,827 refers to over 250 systems and states that, for most of them, liquid entrapment at the interface is lacking. J. L. Reger in Interim Report, May, 1973 under NASA Contract NAS8-28267 entitled "Study on Processing Immiscible Materials in Zero Gravity" discloses over 500 systems and identifies various areas of application for composite materials utilizing such systems.

Figure 8:
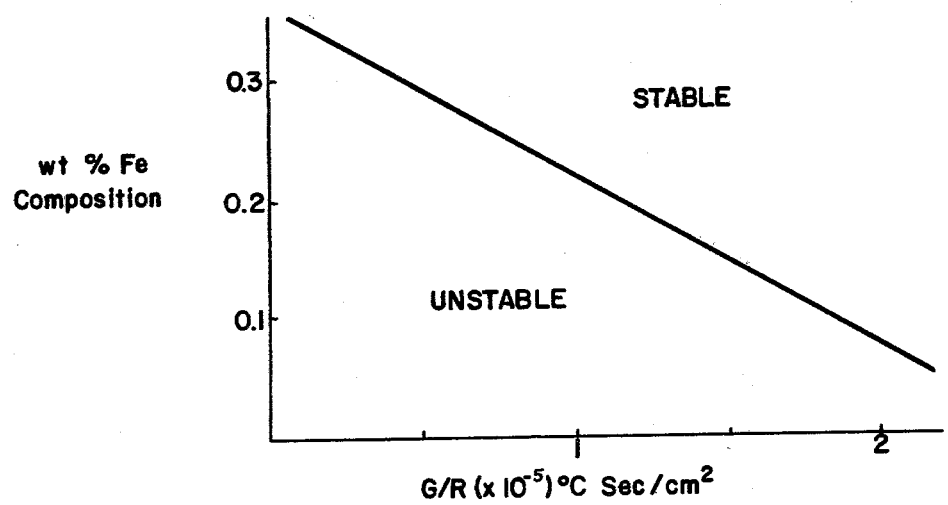
FIG. 8 is a graph showing the effect of the amount of Fe dopant on interface stability in the process of this invention.

A chosen monotectic system can be processed according to the invention by providing in the alloy melt a dopant that causes the liquid-solid interface for the selected system to break down into a cellular pattern as it progresses through the melt during directional solidification. For systems wherein aluminum is the major component, for example, AL-Bi or AL-Pb; a transition element such as iron, nickel or cobalt can be used, and iron is preferred. For zinc-based systems such as Zn-Bi, iron is also the preferred dopant. The dopant is provided in a small amount, generally of the order of —0.1 to 0.6 percent by weight, the amount required depending on the particular system and dopant employed. In the case of iron dopant in Al-Bi (Bi content 3 to 4 weight percent—a dopant concentration of 0.1 to 0.3 weight percent is preferred. As illustrated in FIG. 8, the amount of dopant required for break-down of interface stability varies with the ratio of growth rate to temperature gradient.

Figure 5:
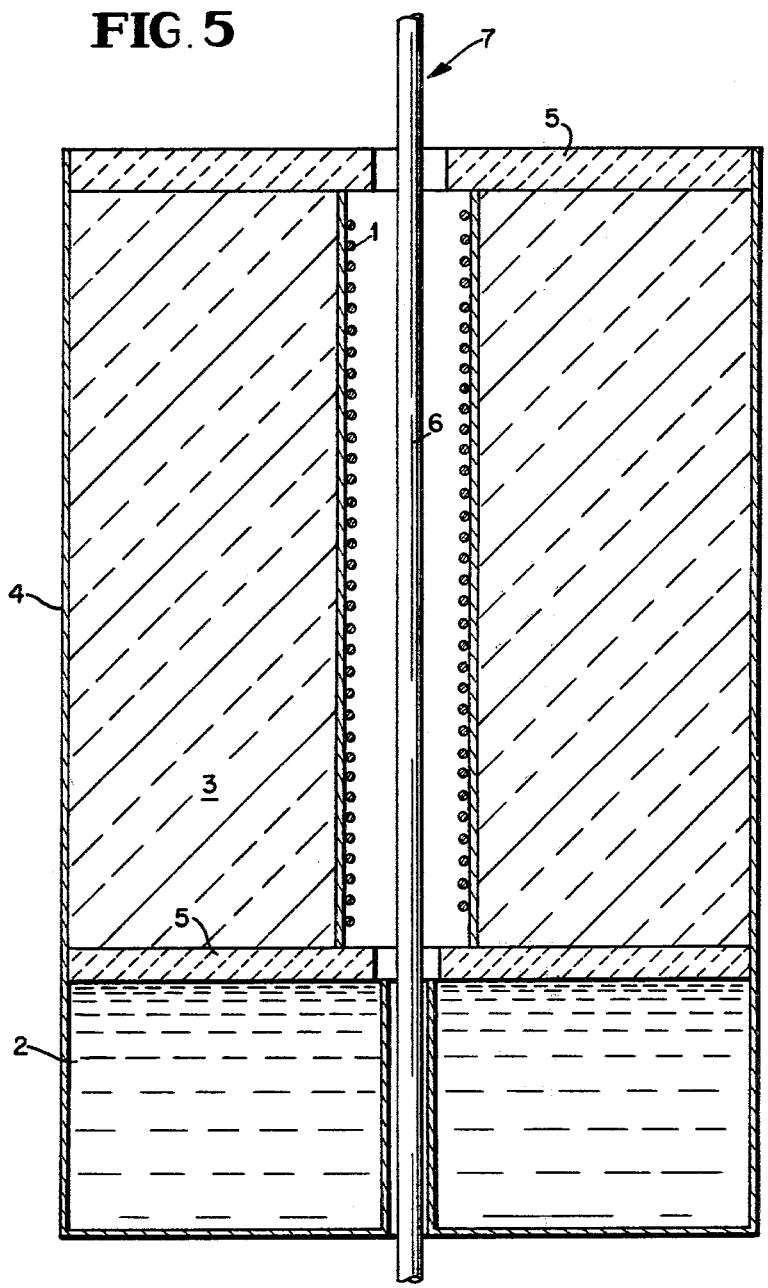
FIG. 5 is a schematic drawing of a directional solidification furnace useable in the practice of this invention, FIG. 6, a through d, illustrates the mechanism by which alloy structures are believed to be formed in accordance with the invention.

Alloys embodying the invention are prepared by forming a melt containing major and minor components of the selected alloy system and a small mount of dopant and directionally solidifying the melt. A suitable apparatus for carrying out the process is shown in FIG. 5. The directional solidification furnace system has a heating element 1 wound and insulated to provide a flat temperature profile at elevated temperatures and a quench block 2 through which cooling water is circulated. The furnace has an outer steel jacket 4 and ceramic fiber insulation 3 disposed between the heating coil and the jacket. Top and bottom areas of the heated area are delineated by a layer of transite asbestos cement 5. The sample being treated 6 is contained in an alumina rod crucible 7 arranged so that the sample remains stationary while the furnace is moved at a controlled rate by a motor and gear (not shown). Means (not shown) are also provided for determination of temperature gradients in the heated samples.

Figure 6A:
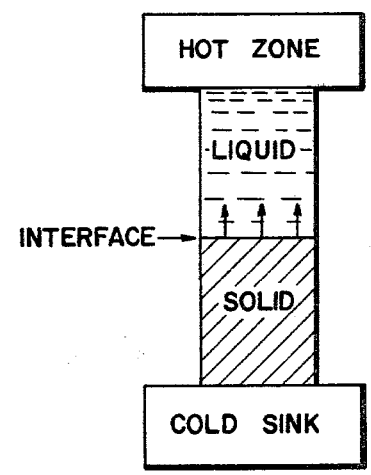
Figure 6B:
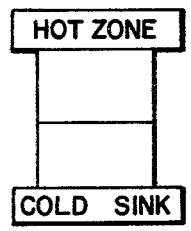
Figure 6C:
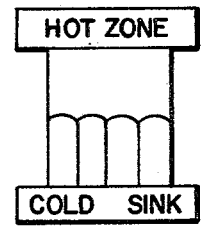

The directional solidification process, depicted in FIG. 6, involves solidification of molten material from one direction (FIG. 6a). The boundary between solid and liquid phases is called the interface. By cooling the bottom of the crucible (cold sink) the interface is caused to move upwardly, giving more solid and less liquid. The rate of movement of the interface is called the growth rate (R) and the temperature difference between the hot zone and cold sink is called the temperature gradient (G).

Figure 6D:
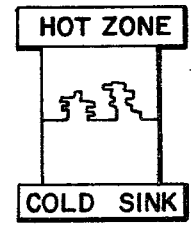

The shape of the interface is determined by the presence or absence of a dopant and in interface stability criterion defined as the G/R ratio. These factors determine whether the flat interface of FIG. 6b breaks down to the cellular pattern of FIG. 6c, or eventually to a dendritic interface as shown in FIG. 6d. Control of the G/R ratio and provision of a dopant are employed in the present invention to obtain the cellular pattern of FIG. 6c, by means of which aligned spheres or rods of the minor component are produced.

Temperature gradient and growth rate values are selected to provide the desired shaping of the minor component into rods as spheres and to control their diameter and distance from one another. A temperature gradient G from 150 to 600 C/cm and a growth rate R from 0.6 to 22 centimeters per hour can be used for Al-Bi and Al-Pb systems using an iron dopant. In terms of G/R ratio, a ratio from $1 \times 10^5$ C/sec/cm to $1 \times 10^6$ C/sec/cm$^2$ is preferred.

Figure 7:
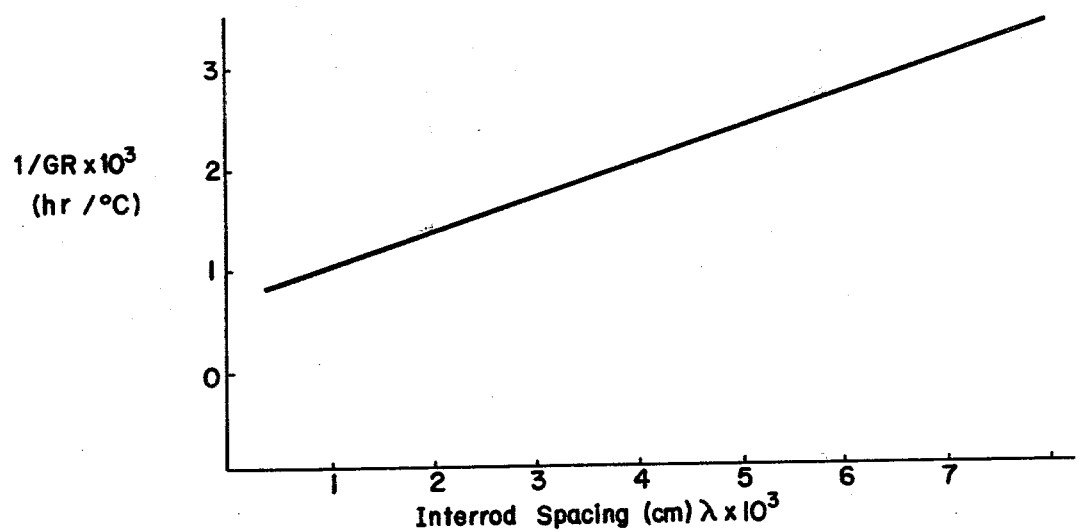
FIG. 7 is a graph showing the relationship of the product of G and R values to inter-rod spacing in composite articles embodying the invention.

With regard to control of size and spacing of spheres or rods, spacing varies inversely with the product of G times R as shown in FIG. 7. At Lower growth rates within the range stated above, the minor component takes the form of continuous rods, and discrete spheres are formed at higher growth rates. In the system Al-3.4Bi-0.2 Fe, for example, spheres are formed at growth rates above 1 Cm/hr. Rods can be broken up into spheres by reheating and quenching the component alloy. Size of the spheres varies the growth rate and temperature gradient in accordance with RG $\frac{1}{4}$, and it can be controlled within limits by adjustment of R and G values.

DESCRIPTION OF PREFERRED EMBODIMENTS

In the Al-Bi alloys of this invention, the dopant is preferably 0.1–0.6% by weight of Fe and the Al-Bi alloy contains 3–8% by weight of Bi. Most preferably, the dopant is 0.1–0.3% by weight of Fe and the Al-Bi alloy contains 3–4% by weight of Bi.

Al-Pb alloys are preferably those containing 1.5–5.9% by weight of Pb, wherein the dopant is 0.2 to 0.6% by weight of Fe.

Applied to the preparation of Al-Bi alloys, conditions are preferred in which the minor component is 3–8% by weight of Bi, the dopant is 0.1–0.6% by weight of Fe, the processing means is a directional solidification furnace and the temperature gradient/growth rate ratio is $3 \times 10^5 - 2.3 \times 10^6$ C./sec./cm.$^2$. Most preferably the minor component is 3–4% by weight of Bi and the dopant is 0.1–0.3% by weight of Fe.

In the preparation of Al-Pb alloys, the minor component is preferably 1.5–5.9% by weight of Pb, the dopant is 0.2 to 0.6% by weight of Fe, the processing means is a directional solidification furance and the temperature gradient/growth rate ratio is $1 \times 10^5$ to $1 \times 10^6$ C/sec/cm$^2$.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever. In the following examples, the temperatures are set forth uncorrected in degrees Celsius; unless otherwise indicated, all parts and percentages are by weight.

EXAMPLE I

A rapid directional solidification furnace was modified to produce a wide range of growth rates and temperature gradients. As shown in FIG. 5, the furnace system consisted of a heating element (1) specifically wound and insulated to provide a flat temperature profile at elevated temperatures and a quench block (2) through which water at 21 degrees C. flowed at 2000 cc./min. The apparatus was insulated by ceramic fiber insulation (3) and had a steel jacket (4). The top and bottom of the heated area were delineated by a layer of transite asbestos cement (5). The sample being treated (6) was contained in an alumina crucible (7), arranged so that the sample remained stationary while the furnace was moved at the desired rate by a motor and gear system. The growth rate was assumed to equal the rate of furnace movement. Temperature gradients were measured using dummy cartridges and represent temperatures in the molten material.

Samples were prepared by weighing out the desired amount of major constituents and the calculated amount of dopant. The main constituent was melted 200 degrees C. above the melting point of the alloy. When the main constituent was molten, the second constituent was poured into the crucible, making sure that the pellets penetrated the oxide layer and entered the melt. The dopant was then added, and the materials were soaked together for two hours to insure homogeneity.

To prepare samples for the furnace, the melt was either cast and rolled into wies, then placed in the crucible, or the crucible was attached to a roughing pump and the resulting partial vacuum was used to draw the molten alloy into the tube. The samples were 2 mm. in diameter by 15 mm. in length. Examination of representative specimens revealed a uniform dispersion of constituents.

The samples were solidified at rates ranging from 0.5 cm./hr. to 21 cm./hr. and at temperature gradients from 150 degrees C./cm. to 410 degrees C./cm. giving temperature gradient (g) /growth rate (R) values between $1.7 \times 10^5$ and $2.3 \times 10^6$ degrees C./sec./cm.$^2$. After the samples were removed from the crucibles, they were mounted, sectioned longitudinally, and polished. Metallographic examination of both the starting and quenched interfaces assured that they were flat. Cursory X-ray laue analysis indicated that the samples were either single crystals or composed of very large grains.

Figure 1:
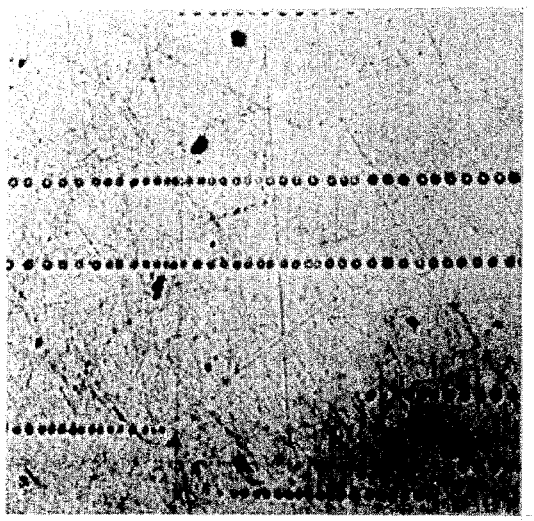
FIG. 1 is a photomicrograph, longitudinal section, (200×) showing bismuth spheres aligned in an aluminum matrix (1–3.4 Bi-0.2 Fe)

The bismuth was clearly visible in the aluminum matrix without etching. The Al-3.4 Bi samples showed no directionality; platelets of bismuth were distributed uniformly in the aluminum. In Al-3.4 Bi-0-2 Fe samples, arrays of bismuth spheres were aligned parallel to the direction of solidification. In FIG. 1, is shown a photomicrograph of a product obtained at a solidification rate of 2 cm./hr. and a growth rate of 290 degrees C./cm. (Al-3.4 Bi-0.2 Fe; 200× magnification).

For Al-3.4 Bi-0.2 Fe samples, Table I gives the spatial distribution of the minor constituent and the growth parameters. It will be apparent that beginning with G/R values near $3.16 \times 10^5$, the structure became less regular and that samples obtained at G/R values of $1.01 \times 10^5$ and less were unaligned.

TABLE I

| Sample | G (°C./cm) | R (cm/hr) | (cm) × 10$^3$ | G/R (C/sec/cm$^2$) × 10$^{+5}$ | Structure* |
|---|---|---|---|---|---|
| AB27 | 410 | 1.15 | 0.79 | 9.8 | A |
| AB25 | 290 | 4.3 | 0.64 | 2.4 | A |
| AB22 | 410 | 2.5 | 0.66 | 7.4 | A |
| AB20 | 290 | 2.05 | 1.45 | 5.1 | A |
| AB19 | 410 | 1.87 | 0.79 | 7.89 | A |
| AB17 | 156 | 1.78 | | 3.16 | P |
| AB18 | 156 | 1.98 | 8.0 | 2.85 | P |
| AB13 | 410 | 2.2 | 1.46 | 4.47 | A |
| AB12 | 290 | 2.2 | 1.4 | 4.75 | A |
| AB25 | 290 | 10.3 | | 1.01 | U |
| AB11 | 410 | 21.75 | | 0.68 | U |
| AB14 | 156 | 3.3 | | 1.7 | P |
| AB10 | 290 | 2.2 | 0.79 | 5.2 | A |

*A = aligned
P = partial alignment
U = unaligned

EXAMPLE II

Cross-sectional samples of compositions prepared by the procedure of Example I were prepared, and their transverse properties were examined. Typically the spheres of bismuth were found to be arranged in a cellular pattern, and at growth rates below 1 cm./hr., the bismuth occurred as rods rather than spheres. A computer program was written to determine the nearest neighbor spacings and to give an indication of the periodicity of the samples. The first nearest neighbor distance is shown plotted as function of 1/GR in FIG. 7. As indicated in FIG. 7, spacing distance varies inversely with GR.

EXAMPLE III

The system Al-3.4 Bi, with varying amounts of Fe, was examined as in the above examples to determine the interface stability, G/R, as a function of the amount of iron in the composition. The results obtained are shown in FIG. 8 for the particular G and R values employed, an amount of iron from 0.1 to 0.3 is shown to maintain an unstable interface necessary for the formation of spheres or rods.

EXAMPLE IV

Figure 2:
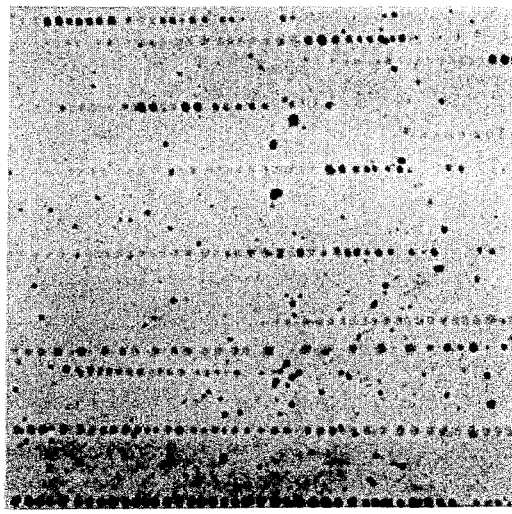
FIG. 2 is a photomicrograph, longitudinal section (200×) of lead spheres aligned in an aluminum matrix (Al-1.9Pb-0.2 Fe)

A sample of the composition Al-1.9Pb-0.2 Fe was prepared according to the procedure of Example I, at a growth rate of 2 cm./hr. and a temperature gradient of 410 C/cm. A photomicrograph of a longitudinal section (magnification 200×) is shown in FIG. 2. Distribution of the lead in the form of aligned spheres is clearly shown in the photomicrograph.

EXAMPLE V

Figure 3:
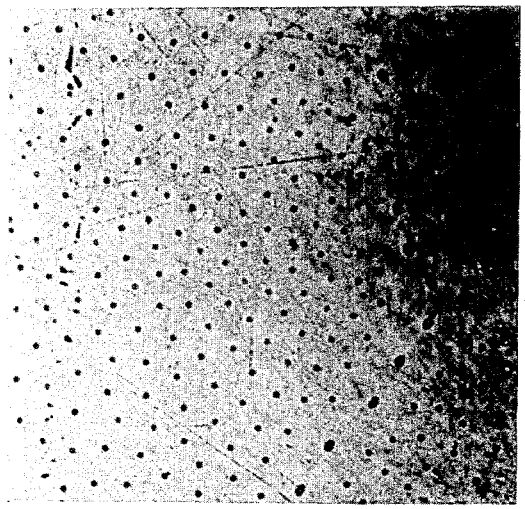
FIG. 3 is a photomicrograph, cross-section (100×) of lead rods aligned in an aluminum matrix (Al-4Pb-0.2 Fe)

A sample of the composition Al-4Pb-0.2 Fe was prepared according to the procedure of Example I, at a growth rate of 2 cm./hr. and a temperature gradient of 410 C/cm. A photomicrograph of a cross-section (magnification 100×) is shown in FIG. 3. In this case, the lead took the form of continuous rods spaced as shown in the photomicrograph.

EXAMPLE VI

Figure 4:
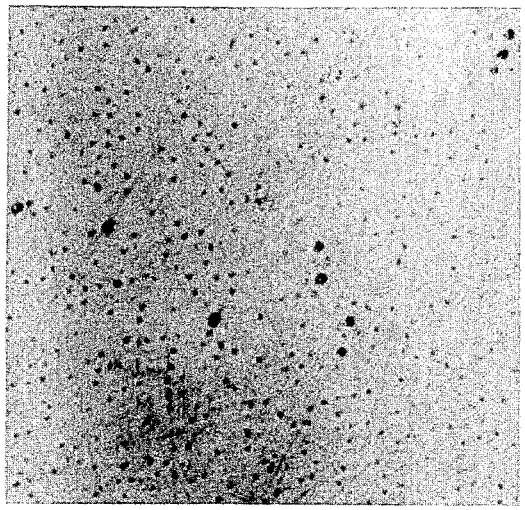
FIG. 4 is a photomicrograph, cross-section (400×) of bismuth spheres in a zinc matrix (Zn-1.9 Bi-0.2Fe)

A sample of the composition Zn-1.9 Bi-0.1 Fe was prepared according to the procedure of Example I, at a growth rate of 7 cm./hr. and a temperature gradient of 410 C/cm. A photomicrograph of a cross-section (magnification 400×) is shown in FIG. 4. Regular distribution of bismuth spheres in the zinc matrix is shown in this Figure.

The preceding examples can be repeated with similar success by substituting the generically or specifically described reactants and/or operation conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. The method of preparing a monotectic alloy having aligned spherical particles or rods of the minor component of a monotectic alloy system dispersed in a matrix of the major component thereof which comprises:
   (a) forming a melt containing predetermined amounts of said major and minor components and a dopant characterized by its ability to provide breakdown of the liquid-solid interface for said system into a cellular pattern upon directional solidification of the melt; and (b) directionally solidifying the melt at a predetermined temperature gradient and a predetermined growth rate.

2. The method of claim 1 wherein said major component is aluminum or zinc the minor component is bismuth or lead and the dopant is a transition element.

3. The method of claim 2 wherein said dopant is iron.

4. The method of claim 3 wherein the temperature gradient is from 150 to 600 degrees C. and the growth rate is from 0.6 to 22 centimeters per hour.

5. The method of claim 4 wherein the major component is aluminum, the minor component is bismuth at a concentration of 3 to 8 weight percent and the dopant is iron at a concentration of 0.1 to 0.3 weight percent.

6. The method of claim 5 wherein the ratio of temperature gradient to growth rate is from $3 \times 10^5$ to $2.3 \times 10^6$ C/sec/cm$^2$.

7. The method of claim 4 where the major component is aluminum, the minor component is lead at a concentration of 1.5 to 5.9 weight percent and the dopant is iron at a concentration of 0.2 to 0.6 weight percent.

8. The method of claim 7 wherein the ratio of temperature gradient to growth rate is from $1 \times 10^5$ to $1 \times 10^6$ C/sec/cm$^2$.

9. A monotectic alloy comprising an aluminum matrix containing 0.1 to 0.6 weight percent iron and having dispersed therein 3 to 8 weight percent bismuth in the form of spherical particles or rods.

10. A monotectic alloy comprising an aluminum matrix containing 0.2 to 0.6 weight percent iron and having dispersed therein 1.5 to 5.9 weight percent lead in the form of spherical particles or rods.

11. A monotectic alloy comprising a zinc matrix having dispersed therein 1.9 weight percent bismuth in the form of spherical particles and 0.1 weight percent iron.

* * * * *